United States Patent
Yamanashi et al.

(10) Patent No.: US 8,760,323 B2
(45) Date of Patent: Jun. 24, 2014

(54) ENCODING DEVICE AND ENCODING METHOD

(75) Inventors: Tomofumi Yamanashi, Kanagawa (JP); Masahiro Oshikiri, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/822,823

(22) PCT Filed: Sep. 7, 2011

(86) PCT No.: PCT/JP2011/005014
§ 371 (c)(1),
(2), (4) Date: Mar. 13, 2013

(87) PCT Pub. No.: WO2012/053146
PCT Pub. Date: Apr. 26, 2012

(65) Prior Publication Data
US 2013/0176150 A1    Jul. 11, 2013

(30) Foreign Application Priority Data

Oct. 20, 2010    (JP) ................................ 2010-235279

(51) Int. Cl.
*H03M 13/00*    (2006.01)
*H03M 7/30*    (2006.01)

(52) U.S. Cl.
CPC ....................................... *H03M 7/30* (2013.01)
USPC ................ 341/50; 341/87; 348/241; 382/275

(58) Field of Classification Search
CPC .... H03M 7/3059; H03M 7/3082; H04N 7/26; G11B 27/00; H04L 27/2663
USPC ............ 341/50, 87, 51, 94; 348/241; 382/275
See application file for complete search history.

(56) References Cited

U.S. PATENT DOCUMENTS

| | | | |
|---|---|---|---|
| 5,060,268 A | 10/1991 | Asakawa et al. | |
| 5,199,076 A | 3/1993 | Taniguchi et al. | |
| 8,027,412 B2 * | 9/2011 | Oh ................................ | 375/340 |
| 8,315,396 B2 * | 11/2012 | Schreiner et al. ............... | 381/20 |
| 8,477,750 B2 * | 7/2013 | Agarwal et al. ................ | 370/338 |
| 8,576,961 B1 * | 11/2013 | Zhu et al. ....................... | 375/343 |
| 2003/0177004 A1 | 9/2003 | Jabri et al. | |
| 2004/0172402 A1 | 9/2004 | Jabri et al. | |
| 2013/0124201 A1 | 5/2013 | Yamanashi et al. | |
| 2014/0037215 A1 * | 2/2014 | Kumar et al. .................. | 382/197 |

FOREIGN PATENT DOCUMENTS

| | | |
|---|---|---|
| JP | 60-150100 | 8/1985 |
| JP | 62-194296 | 8/1987 |
| JP | 5-61499 | 3/1993 |
| JP | 5-158497 | 6/1993 |
| JP | 2000-235399 | 8/2000 |
| JP | 2006-504123 | 2/2006 |
| JP | 2010-44412 | 2/2010 |

\* cited by examiner

*Primary Examiner* — Peguy Jean Pierre
(74) *Attorney, Agent, or Firm* — Greenblum & Bernstein, P.L.C.

(57) ABSTRACT

An encoding device enables the amount of processing operations to be significantly reduced while minimizing deterioration in the quality of an output signal. This encoding device (101) encodes an input signal by determining the correlation between a first signal generated by using the input signal and a second signal generated by a predetermined method. An importance assessment unit (202) sets the importance of each of a plurality of processing units obtained by dividing the frames of the input signal. A CELP coder (203) performs sparse processing in which the amplitude value of a predetermined number of samples among multiple samples constituted by the first signal and/or the second signal in each processing unit is set to zero according to the importance that was set for each processing unit, and calculates the correlation between the first signal and the second signal, either of which was subjected to sparse processing.

10 Claims, 4 Drawing Sheets

ENCODING DEVICE AND ENCODING METHOD

TECHNICAL FIELD

The present invention relates to a coding apparatus and coding method for use in a communications system in which signals are coded and transmitted.

BACKGROUND ART

When transmitting speech signals/sound signals through a packet communications system, as exemplified by Internet communications, or through a mobile communications system, and/or the like, compression techniques/coding techniques are often employed to improve transmission efficiency for speech signals/sound signals. While on the one hand, speech signals/sound signals are simply coded at low bit rates, there are growing needs for techniques that code speech signals/sound signals of wider bands, as well as techniques that carry out coding/decoding with small computation amounts without degrading sound quality.

In response to such needs, various techniques that reduce computation amounts without degrading the quality of the decoded signal are being developed. By way of example, with the technique disclosed in Patent Literature 1, computation amounts for pitch period searches (adaptive codebook searches) are reduced in connection with a Code-Excited Linear Prediction (CELP)-type coding apparatus. Specifically, the coding apparatus sparsifies the updating of an adaptive codebook. With respect to the processing method for sparsification, a method is adopted where the value of a sample is replaced with zero (0) when the amplitude of the sample does not exceed a given threshold. Thus, computation amounts are reduced by omitting, at the time of a pitch period search, processing (specifically a multiplication process) for parts where the value of the sample is 0. In addition, there is disclosed a feature where the above-mentioned threshold is made adaptively variable from process to process, as well as a feature where samples are sorted in descending order of absolute value, and where the sample value is replaced with zero (0) for all samples that fall outside of a predetermined number of samples from the top.

CITATION LIST

Patent Literature

PTL1
Japanese Patent Application Laid-Open No. HEI 5-61499

SUMMARY OF INVENTION

Technical Problem

Patent Literature 1 discloses, among others, a feature where a coding apparatus adaptively varies, from process to process (from subframe process to subframe process), a threshold for selecting samples to be sparsified during pitch period searches (i.e., samples whose values are to be set to zero (0)). However, with the method above, while it may indeed be possible in some cases to reduce the average computation amount across a frame as a whole, subframes for which computation amounts can be reduced and subframes for which computation amounts cannot be reduced will coexist, and in terms of the processes per frame, the computation amount may not always be reduced. In other words, with the method above, there is no guarantee that the worst case computation amount (i.e., the computation amount for the frame with the greatest computation amount) would be reduced. Accordingly, it is necessary to significantly reduce computation amounts also with respect to the processes per subframe without degrading the quality of the decoded signal.

An object of the present invention includes providing a coding apparatus and coding method that are capable of always reducing the computation amount of each subframe (i.e., of reducing the worst case computation amount) without degrading the quality of the decoded signal when performing a correlation calculation, such as a pitch period search, in coding an input signal.

Solution to Problem

A coding apparatus according to one aspect of the present invention is a coding apparatus that codes an input signal and generates coded information, the coding apparatus including: a first signal generation section that generates a first signal using the input signal; a second signal generation section that generates a second signal through a predetermined method; a setting section that sets a significance for each of a plurality of processing units obtained by dividing a frame of the input signal; and a correlation computation section that sets, in accordance with the significance set for each of the processing units, amplitude values of a predetermined number of samples to zero, the predetermined number of samples being taken from a plurality of samples forming at least one of the first signal and the second signal of each processing unit, and that computes a correlation between the one signal, for which the amplitude values of the predetermined number of samples have been set to zero, and the other signal.

A coding method according to one aspect of the present invention is a coding method of coding an input signal and generating coded information, the coding method including: a first signal generation step of generating a first signal using the input signal; a second signal generation step of generating a second signal through a predetermined method; a setting step of setting a significance for each of a plurality of processing units obtained by dividing a frame of the input signal; and a correlation computation step of setting, in accordance with the significance set for each of the processing units, amplitude values of a predetermined number of samples to zero, the predetermined number of samples being taken from a plurality of samples forming at least one of the first signal and the second signal of each processing unit, and of computing a correlation between the one signal, for which the amplitude values of the predetermined number of samples have been set to zero, and the other signal.

Advantageous Effects of Invention

With the present invention, when performing a correlation calculation on input signals, by adaptively adjusting, from process to process, the samples to be used for the correlation calculation, it is possible to mitigate quality degradation in the output signal, while at the same time significantly reducing the computation amount. By assessing in advance the significance of each subframe across the frame as a whole, and determining, in accordance with the significance of each subframe, the number of samples to be used for the correlation calculation for each subframe, it is possible to guarantee a reduction of the worst case computation amount.

DESCRIPTION OF EMBODIMENTS

Embodiments of the present invention are described in detail below with reference to the drawings. Descriptions are provided taking audio coding apparatuses and audio decoding apparatuses as examples of coding apparatuses and decoding apparatuses according to the present invention.

Figure 1:
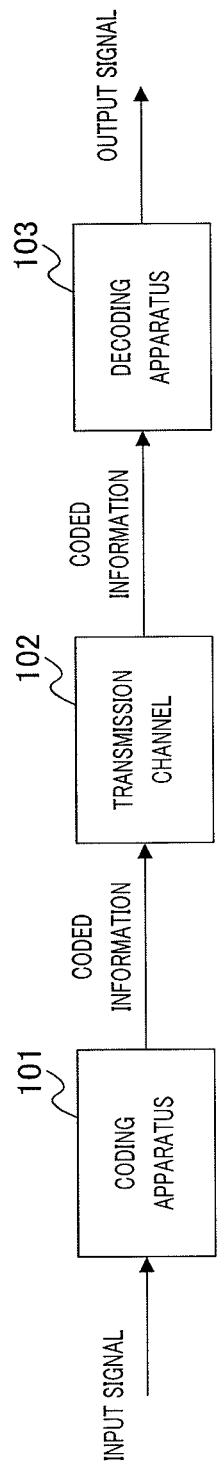
FIG. 1 is a block diagram showing a configuration of a communications system including a coding apparatus and decoding apparatus according to an embodiment of the present invention.

FIG. 1 is a block diagram showing a configuration of a communications system including a coding apparatus and decoding apparatus according to an embodiment of the present invention. With respect to FIG. 1, the communications system includes coding apparatus 101 and decoding apparatus 103, each of which is in a communicable state via transmission channel 102. Both coding apparatus 101 and decoding apparatus 103 are typically used by being incorporated into a base station apparatus, a communications terminal apparatus, and/or the like.

Coding apparatus 101 performs coding on a per-frame basis, where an input signal is divided in units of N samples each (where N is a natural number), and where N samples form one frame. It is assumed that the input signal to be coded is denoted as $x_n$ (where n=0, ..., N−1). n represents the n+1th signal element of the input signal that has been divided into units of N samples each. Coding apparatus 101 sends the coded input information (coded information) to decoding apparatus 103 via transmission channel 102.

Decoding apparatus 103 receives the coded information that has been sent from coding apparatus 101 via transmission channel 102, and decodes it to obtain an output signal.

Figure 2:
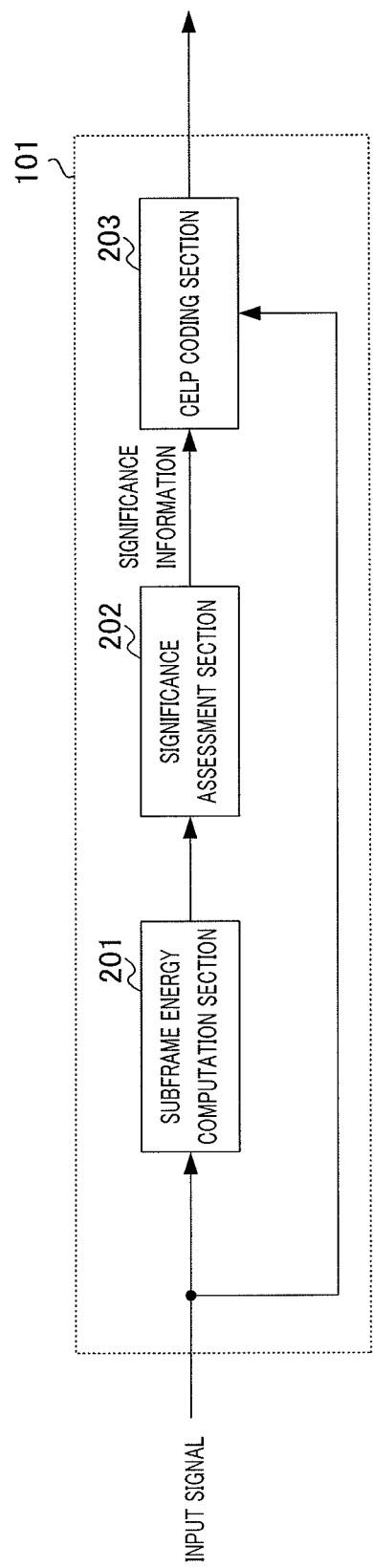
FIG. 2 is a block diagram showing key features inside the coding apparatus shown in FIG. 1 according to an embodiment of the present invention.

FIG. 2 is a block diagram showing an internal configuration of coding apparatus 101 shown in FIG. 1. Coding apparatus 101 generally includes subframe energy computation section 201, significance assessment section 202, and CELP coding section 203. It is assumed that subframe energy computation section 201 and significance assessment section 202 perform processing on a per-frame basis, whereas CELP coding section 203 performs processing on a per-subframe basis. Details of each process are described below.

An input signal is inputted to subframe energy computation section 201. Subframe energy computation section 201 first divides the inputted input signal into subframes. By way of example, a description is provided below with respect to an arrangement where input signal Xn (where n=0, ..., N−1. That is, there are N samples) is divided into $N_s$ subframes (subframe index k=0 to $N_s$−1).

For each divided subframe, subframe energy computation section 201 computes subframe energy $E_k$ (where k=0, ..., $N_s$−1) according to equation 1. Subframe energy computation section 201 outputs the thus computed subframe energy $E_k$ to significance assessment section 202. With respect to equation 1, it is assumed that $start_k$ and $end_k$ indicate the first and last sample indices, respectively, in the subframe of subframe index k.

(Equation 1)

$$E_k = \sum_{i=start_k}^{end_k} (X_i)^2 \quad (k = 0, \ldots, N_s - 1) \quad [1]$$

Significance assessment section 202 receives subframe energies $E_k$ (where k=0, ..., $N_s$−1) from subframe energy computation section 201. Based on the subframe energies, significance assessment section 202 determines the significance of each subframe. Specifically, significance assessment section 202 assigns correspondingly greater significances to subframes with greater subframe energies. The significance assigned to each subframe will hereinafter be referred to as significance information. The significance information is hereinafter denoted as $I_k$ (where k=0, ..., $N_s$−1). It is assumed that a smaller $I_k$ value indicates a correspondingly greater significance. By way of example, subframe energies $E_k$ for the respective subframes that have been inputted are sorted in descending order by significance assessment section 202. Starting with the subframe corresponding to the subframe energy that is placed first after sorting (i.e., the subframe with the highest subframe energy), significances are assigned in a decreasing manner (i.e., significance information $I_k$ is assigned in an increasing manner).

By way of example, assuming that subframe energies $E_k$ are related as in equation 2, significance assessment section 202 assigns significances (significance information $I_k$) to the respective subframes (units of processing for CELP coding) as in equation 3.

(Equation 2)

$$E_0 \geq E_2 \geq E_1 \geq E_3 \quad [2]$$

(Equation 3)

$$I_0 = 1$$

$$I_1 = 3$$

$$I_2 = 2$$

$$I_3 = 4 \quad [3]$$

In other words, significance assessment section 202 assigns correspondingly greater significances (correspondingly lesser importance information $I_k$) to subframes with greater subframe energies $E_k$. With respect to equation 3, significance information $I_k$ varies among the subframes within one frame. In other words, significance assessment section 202 assigns significances in such a manner that significance information $I_k$ of the subframes within one frame would always differ from one another.

Significance assessment section 202 then outputs to CELP coding section 203 significance information $I_k$ (where k=0, ..., $N_s$−1) thus assigned. Although equations 2 and 3 above assume, as an example, a case involving four subframes, the present invention is by no means limited in terms of the number of subframes, and is equally applicable to subframe numbers other than four, which is described above by way of example. Furthermore, equation 3 merely shows example settings for significance information $I_k$. The present invention is equally applicable to settings that use values other than those of equation 3.

The input signal, as well as significance information $I_k$ (where $k=0, \ldots, N_s-1$) from significance assessment section 202, are inputted to CELP coding section 203. Using the inputted significance information, CELP coding section 203 codes the input signal. Details of a coding process at CELP coding section 203 are described below.

Figure 3:
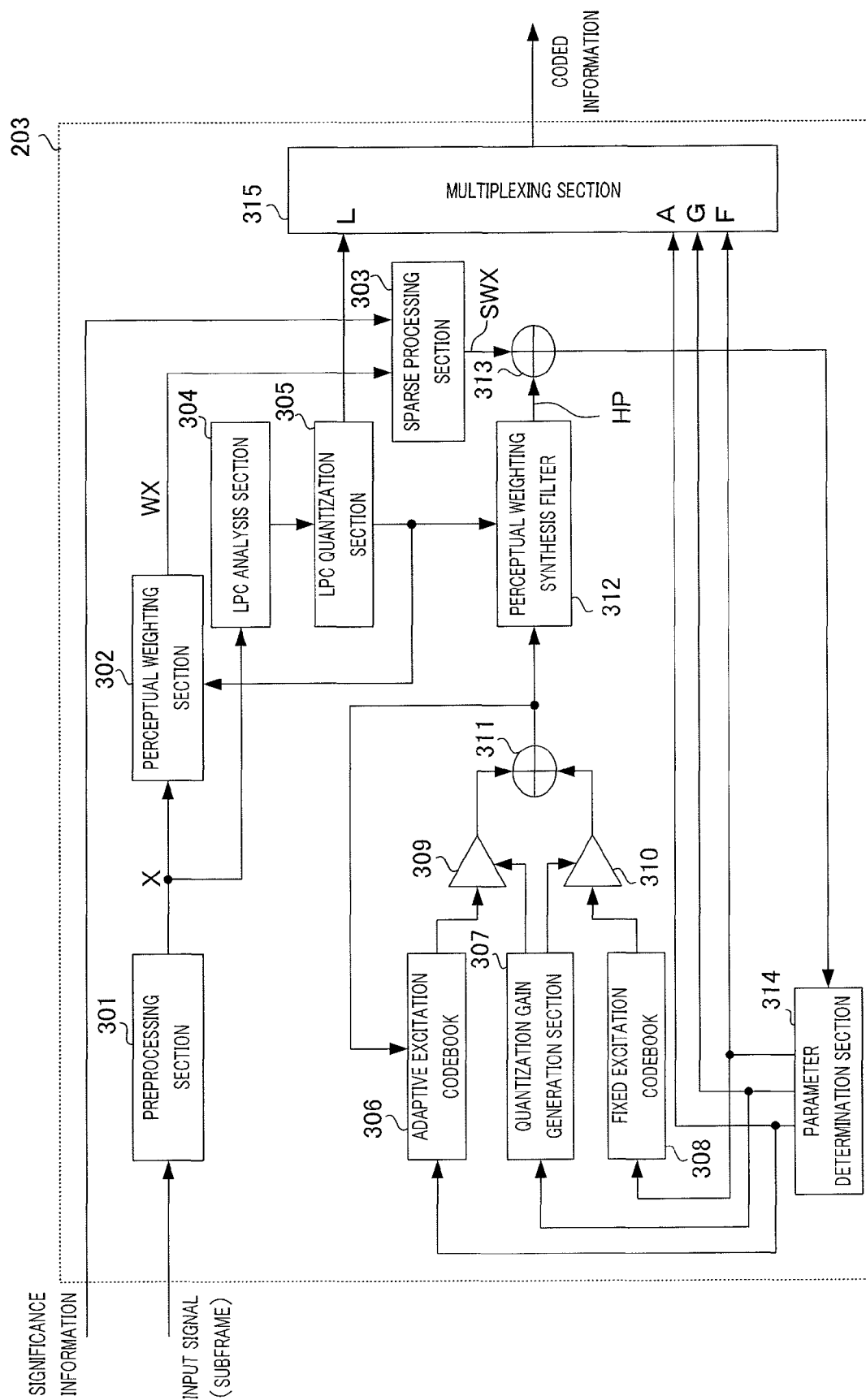
FIG. 3 is a block diagram showing key features inside the CELP coding section shown in FIG. 2 according to an embodiment of the present invention.

FIG. 3 is a block diagram showing an internal configuration of CELP coding section 203. CELP coding section 203 generally includes preprocessing section 301, perceptual weighting section 302, sparse processing section 303, linear prediction coefficient (LPC) analysis section 304, LPC quantization section 305, adaptive excitation codebook 306, quantization gain generation section 307, fixed excitation codebook 308, multiplier sections 309 and 310, adder sections 311 and 313, perceptual weighting synthesis filter 312, parameter determination section 314, and multiplexing section 315. Details of each processing section are described below.

With respect to input signal $x_n$, preprocessing section 301 performs a high-pass filter process, which removes DC components, and a waveform shaping process or pre-emphasis process, which is intended to improve the performance of the coding process that ensues. The input signal $x_n$ (where $n=0, \ldots, N-1$) thus processed is outputted to perceptual weighting section 302 and LPC analysis section 304.

Using quantized LPCs outputted from LPC quantization section 305, perceptual weighting section 302 perceptually weights input signal $X_n$ outputted from preprocessing section 301, thus generating perceptually weighted input signal $WX_n$ (where $n=0, \ldots, N-1$). Perceptual weighting section 302 then outputs perceptually weighted input signal $WX_n$ to sparse processing section 303.

Using significance information $I_k$ (where $k=0, \ldots, N_s-1$) inputted from significance assessment section 202 (FIG. 2), sparse processing section 303 performs sparse processing on perceptually weighted input signal $WX_n$ inputted from perceptual weighting section 302. Specifically, sparse processing section 303 performs sparse processing where, of a plurality of samples (sample indices $start_k$-$end_k$) forming input signal WX in each subframe k, the amplitude values of a predetermined number of samples are set to zero. Details of sparse processing are described below.

Based on inputted significance information $I_k$ (where $k=0, \ldots, N_s-1$), sparse processing section 303 performs sparse processing on inputted perceptually weighted input signal $WX_n$. For the case at hand, a description will be provided for a process where, as an example of sparse processing, with respect to perceptually weighted input signal $WX_n$, a predetermined number of samples are selected working down from the sample with the greatest absolute amplitude value, and setting the values of the remaining samples to 0. The predetermined number mentioned above is set adaptively based on significance information $I_k$ (where $k=0, \ldots, N_s-1$). An example setting for the above-mentioned predetermined number for a case where significance information $I_k$ (where $k=0, \ldots, N_s-1$) is as given in equation 3 is indicated below through equation 4. Assuming $T_k$ (where $k=0, \ldots, N_s-1$) denotes the predetermined number, equation 4 illustrates an example where subframe count $N_s$ is 4.

(Equation 4)

$T_0=12$ $T_1=6$ $T_2=10$ $T_3=8$ [4]

In the case of equation 4, sparse processing section 303 selects, in the first subframe (subframe index $k=0$) and with respect to perceptually weighted input signal $WX_n$ (where $n=start_0$-$end_0$), predetermined number $T_0$ (=15) of samples starting with the sample with the greatest absolute amplitude value and working down therefrom, and sets the values of the non-selected samples to 0. Likewise, sparse processing section 303 selects, in the second subframe (subframe index $k=1$) and with respect to perceptually weighted input signal $WX_n$ (where $n=start_1$-$end_1$), predetermined number $T_1$ (=10) of samples starting with the sample with the greatest absolute amplitude value and working down therefrom, and sets the values of the non-selected samples to 0. The third and fourth subframes (subframe indices $k=2, 3$) are similarly processed.

Specifically, sparse processing section 303 sets predetermined number $T_k$ to a greater value in accordance with how small the value of significance information $I_k$ is for the subframe (i.e., how high the significance of the subframe is). In other words, sparse processing section 303 reduces the number of samples whose amplitude values are to be set to zero in accordance with how small the value of significance information $I_k$ is for the subframe (i.e., how high the significance of the subframe is). In addition, with respect to each subframe, of a plurality of samples that form the input signal, sparse processing section 303 sets the amplitude values of a predetermined number of samples with lesser amplitude values (i.e., (the number of samples within one subframe—$T_k$) samples) to zero.

Sparse processing section 303 then outputs the sparse processed input signal (sparsified perceptually weighted input signals $SWX_n$) to adder section 313.

LPC analysis section 304 performs a linear prediction analysis using input signal Xn outputetd from preprocessing section 301, and outputs the analysis result (linear prediction coefficient: LPC) to LPC quantization section 305.

LPC quantization section 305 quantizes the linear prediction coefficients (LPCs) outputted from LPC analysis section 304, and outputs the obtained quantized LPCs to perceptual weighting section 302 and perceptual weighting synthesis filter 312. In addition, LPC quantization section 305 outputs to multiplexing section 315 a code (L) representing the quantized LPCs.

Adaptive excitation codebook 306 stores in a buffer the excitations that have hitherto been outputted by adder section 311, and extracts, and outputs to multiplier section 309, one frame's worth of samples as an adaptive excitation vector from a past excitation identified by the signals outputted from parameter determination section 314, which is described hereinbelow.

Quantization gain generation section 307 outputs to multiplier section 309 and multiplier section 310 the quantized adaptive excitation gain and the quantized fixed excitation gain, respectively, identified by the signal outputted from parameter determination section 314.

Fixed excitation codebook 308 outputs, to multiplier section 310 and as a fixed excitation vector, a pulsed excitation vector having a shape identified by the signal outputted from parameter determination section 314. Fixed excitation codebook 308 may also output, to multiplier section 310 and as a fixed excitation vector, that which is obtained by multiplying the pulsed excitation vector by a spreading vector.

Multiplier section 309 multiplies the adaptive excitation vector outputted from adaptive excitation codebook 306 by the quantized adaptive excitation gain outputted from quantization gain generation section 307, and outputs to adder section 311 the gain-multiplied adaptive excitation vector. Multiplier section 310 multiplies the fixed excitation vector outputted from fixed excitation codebook 308 by the quantized fixed excitation gain outputted from quantization gain generation section 307, and outputs to adder section 311 the gain-multiplied fixed excitation vector.

Adder section 311 performs a vector addition of the gain-multiplied adaptive excitation vector outputted from multiplier section 309 and the gain-multiplied fixed excitation vector outputted from multiplier section 310, and outputs the excitation, which is the resultant sum, to perceptual weighting synthesis filter 312 and adaptive excitation codebook 306. The excitation outputted to adaptive excitation codebook 306 is stored in the buffer of adaptive excitation codebook 306.

Using filter coefficients based on the quantized LPCs outputted from LPC quantization section 305, perceptual weighting synthesis filter 312 performs filter synthesis with respect to the excitation outputted from adder section 311 to generate synthesized signal $HP_n$ (where n=0, . . . , N−1), and outputs synthesized signal $HP_n$ to adder section 313.

Adder section 313 reverses the polarity of synthesized signal $HP_n$ outputted from perceptual weighting synthesis filter 312, adds the synthesized signal whose polarity has been reversed to sparsified perceptually weighted input signal $SWX_n$ outputted from sparse processing section 303 to compute error signals, and outputs the error signals to parameter determination section 314.

Parameter determination section 314 selects from adaptive excitation codebook 306, fixed excitation codebook 308, and quantization gain generation section 307 the adaptive excitation vector, fixed excitation vector, and quantization gain, respectively, that result in the least coding distortion of the error signal outputted from adder section 313, and outputs to multiplexing section 315 an adaptive excitation vector code (A), a fixed excitation vector code (F), and a quantization gain code (G) that indicate the selection results.

Details of processes at adder section 313 and parameter determination section 314 are described below. Coding apparatus 101 codes an input signal by determining the correlation between the input signal, which has been subjected to certain processes (e.g., preprocessing, a perceptual weighting process, and/or the like), and a synthesized signal, which is generated using coodbooks (adaptive excitation codebook 306, fixed excitation codebook 308) and filter coefficients based on quantized LPCs. Specifically, parameter determination section 314 searches for synthesized signal $HP_n$ (i.e., various indices (codes (A), (F), (G))) that results in the least error (coding distortion) relative to sparsified perceptually weighted input signal $SWX_n$. The error calculation above is performed as follows.

Ordinarily, difference $D_k$ between two signals (synthesized signal $HP_n$ and sparsified perceptually weighted input signal $SWX_n$) is computed as in equation 5.

(Equation 5)

$$D_k = \sum_{i=start_k}^{end_k} (SWX_i)^2 - \frac{\sum_{i=start_k}^{end_k} ((SWX_i)(HP_i))^2}{\sum_{i=start_k}^{end_k} (HP_i)^2}$$

$(k = 0, \ldots, N_s - 1)$

With respect to equation 5, the first term is the energy of sparsified perceptually weighted input signal $SWX_n$, and is constant. Accordingly, it follows that, in order to minimize error $D_k$ in equation 5, the second term may be maximized. With the present invention, at sparse processing section 303, the samples subject to the computation of the second term in equation 5 are limited using significance information $I_k$ (where k=0, . . . , $N_s$−1) outputted from significance assessment section 202 (FIG. 2), and the computation amount involved in the computation of the second term is thus reduced.

Specifically, sparse processing section 303 selects, in descending order of absolute amplitude value (i.e., in order starting with the greatest absolute amplitude value), a predetermined number ($T_k$) of samples for each subframe k, where predetermined number $T_k$ is set in accordance with significance information $I_k$. Thus, the second term in equation 5 is computed only for the selected samples. In other words, adder section 313 computes the correlation between the input signal in each subframe and the synthesized signal, where the input signal is such that, of its constituent plurality of samples, a predetermined number of samples have their amplitude values set to zero.

By way of example, where significance information $I_k$ assumes the values indicated in equation 3, sparse processing section 303 selects, with respect to the first subframe (subframe index k=0) and as indicated by equation 4, "12" samples ($T_0$=12) with large absolute values of amplitude (i.e., the top 12 samples in terms of their absolute values of amplitude). Likewise, sparse processing section 303 selects, with respect to the second subframe (subframe index k=1), "6" samples ($T_1$=6) with large absolute values of amplitude (i.e., the top 6 samples in terms of their absolute values of amplitude). The third and fourth subframes (subframe indices k=2, 3) are similarly processed.

Thus, sparse processing section 303 adaptively adjusts, among subframes within a frame, the number of samples subject to the computation of the second term shown in equation 5. In so doing, since the values of the non-selected samples are set to zero (0), parameter determination section 314 is able to omit the multiplication process for the second term shown in equation 5. Consequently, computation amounts for equation 5 can be reduced dramatically. In addition, since the number of samples to be selected is adjusted across all subframes within one frame, computation amounts can be reduced for all subframes. Consequently, a reduction in the worst case computation amount can be guaranteed.

Multiplexing section 315 multiplexes code (L), which represents the quantized LPCs outputted from LPC quantization section 305, and adaptive excitation vector code (A), fixed excitation vector code (F), and quantization gain code (G), which are outputted from parameter determination section 314, and outputs them to transmission channel 102 as coded information.

This concludes this description of a process at CELP coding section 203 shown in FIG. 2.

This concludes this description of a process at coding apparatus 101 shown in FIG. 1.

Figure 4:
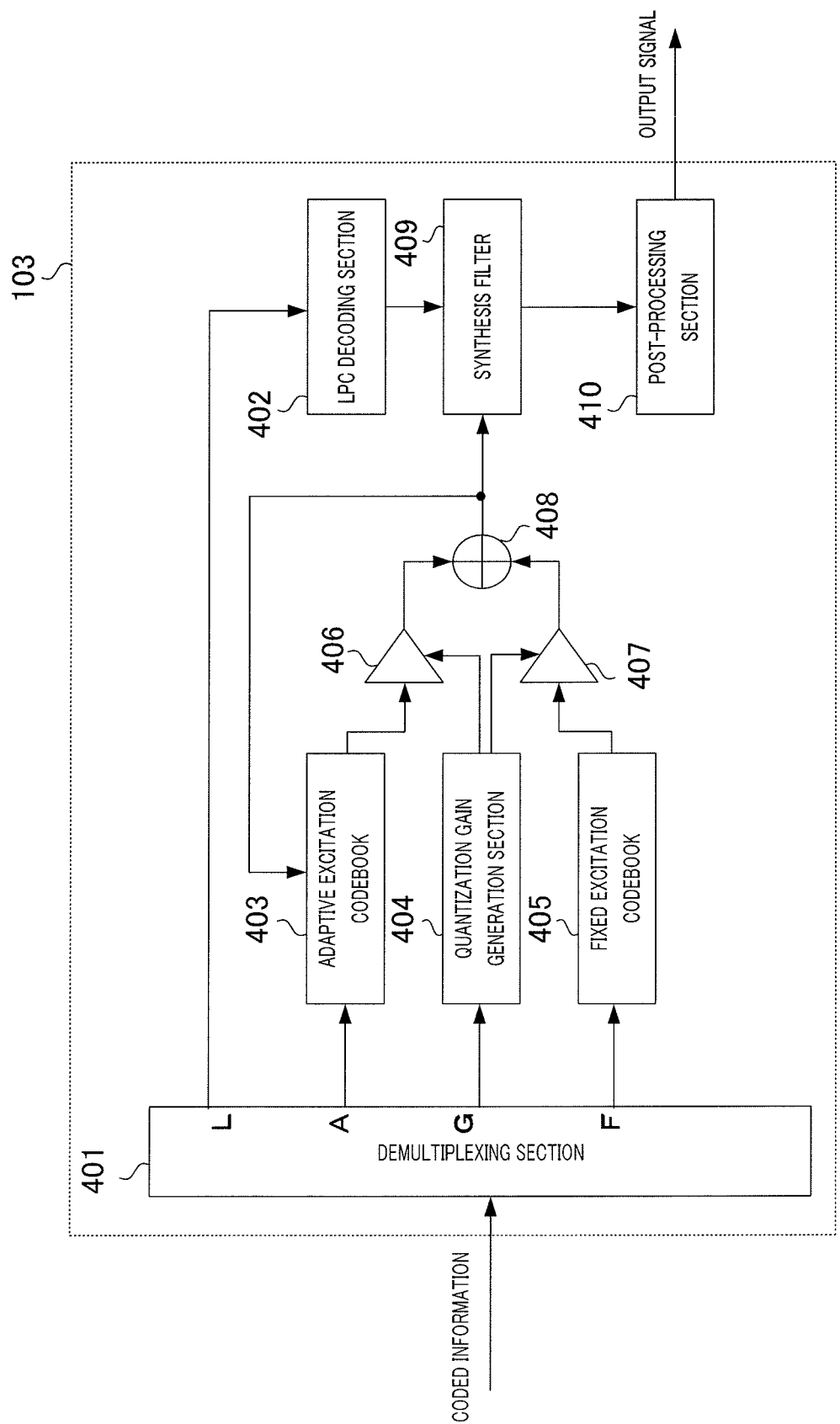
FIG. 4 is a block diagram showing key features inside the decoding apparatus shown in FIG. 1 according to an embodiment of the present invention.

Next, an internal configuration of decoding apparatus 103 shown in FIG. 1 is described using FIG. 4. The description below is with regard to a case where decoding apparatus 103 performs CELP-type audio decoding.

Demultiplexing section 401 demultiplexes the coded information inputted via transmission channel 102 into individual codes (i.e., (L), (A), (G), (F)). Demultiplxed LPC code (L) is outputted to LPC decoding section 402. Demultiplexed adaptive excitation vector code (A) is outputted to adaptive excitation codebook 403. Demultiplexed quantization gain code (G) is outputted to quantization gain generation section 404. Demultiplexed fixed excitation vector code (F) is outputted to fixed excitation codebook 405.

LPC decoding section 402 decodes code (L) outputted from demultiplexing section 401 into quantized LPCs, and outputs the decoded quantized LPCs to synthesis filter 409.

From past excitations specified by adaptive excitation vector code (A) outputted from demultiplexing section 401, adaptive excitation codebook 403 extracts one frame's worth of samples as an adaptive excitation vector, and outputs it to multiplier section 406.

Quantization gain generation section 404 decodes the quantized adaptive excitation gain and quantized fixed excitation gain specified by quantization gain code (G) outputted from demultiplexing section 401, outputs the quantized adaptive excitation gain to multiplier section 406, and outputs the quantized fixed excitation gain to multiplier section 407.

Fixed excitation codebook 405 generates the fixed excitation vector specified by fixed excitation vector code (F) outputted from demultiplexing section 401, and outputs it to multiplier section 407.

Multiplier section 406 multiplies the adaptive excitation vector outputted from adaptive excitation codebook 403 by the quantized adaptive excitation gain outputted from quantization gain generation section 404, and outputs the gain-multiplied adaptive excitation vector to adder section 408. Multiplier section 407 multiplies the fixed excitation vector outputted from fixed excitation codebook 405 by the quantized fixed excitation gain outputted from quantization gain generation section 404, and outputs the gain-multiplied fixed excitation vector to adder section 408.

Adder section 408 adds the gain-multiplied adaptive excitation vector outputted from multiplier section 406 and the gain-multiplied fixed excitation vector outputted from multiplier section 407, thus generating an excitation, and outputs the excitation to synthesis filter 409 and adaptive excitation codebook 403.

Using filter coefficients that are based on the quantized LPCs decoded by LPC decoding section 402, synthesis filter 409 performs filter synthesis of the excitation outputted from adder section 408, and outputs the synthesized signal to post-processing section 410.

Post-processing section 410 performs on the signal outputted from synthesis filter 409 a process for improving the subjective quality of the audio (e.g., formant enhancement, pitch enhancement), a process for improving the subjective quality of stationary noise, and/or the like, and outputs the processed signal as an output signal.

This concludes this description of a process at decoding apparatus 103 shown in FIG. 1.

Thus, according to the present embodiment, a coding apparatus employing a CELP-type coding method first computes, with respect to a frame as a whole, the subframe energy of each subframe. Next, in accordance with the computed subframe energies, the coding apparatus determines the significance of each subframe. Then, during the pitch period search for each subframe, the coding apparatus selects a predetermined number of samples with large absolute amplitude values, the predetermined number being commensurate with significance, computes errors only for the selected samples, and computes the optimum pitch period. Through such an arrangement, it is possible to guarantee a significant reduction in the computation amount across one frame as a whole.

In addition, at the coding apparatus, instead of uniformly determining, across all subframes, the number of samples subject to correlation computation (distance calculation) during a pitch period search, the number of samples may be varied adaptively in accordance with the significances of the subframes. Specifically, for a subframe with a high subframe energy and that is perceptually significant (i.e., a subframe that has high significance), it is possible to carry out a pitch period search accurately. On the other hand, for a subframe with a low subframe energy and that has little impact on perception (i.e., a subframe that has low significance), it is possible to significantly reduce the computation amount by lowering the accuracy of the pitch period search. Thus, the decoded signal can be prevented from suffering significant drops in quality.

With the present embodiment, a configuration has been described as an example where significance information is determined at significance assessment section 202 (FIG. 2) based on the subframe energies computed at subframe energy computation section 201. However, the present invention is by no means limited thereto, and is equally applicable to configurations where significance is determined based on information other than subframe energy. One such example may be a configuration where the degree of signal variability (e.g., spectral flatness measure (SFM)) of each subframe is computed, and significance is increased in accordance with how large the SFM value is. Naturally, significance may be determined based on information other than SFM value.

In addition, with the present embodiment, a predetermined sample count subject to correlation computation (error calculation) is fixedly determined at sparse processing section 303 (FIG. 3) based on significance information determined at significance assessment section 202 (FIG. 2) (e.g., equation 4). However, the present invention is by no means limited thereto, and is equally applicable to configurations where the number of samples subject to correlation computation (error calculation) is determined through methods other than the determination method represented by equation 4. By way of example, if the subframe energies of the subframes that rank high in terms of subframe energy are extremely close in value to one another, significance assessment section 202 may define significance information in such a manner as to allow decimal values, as in (1.0, 2.5, 2.5, 4.0), instead of simply defining them with integers such as (1, 2, 3, 4). In other words, depending on the subframe energy differences among the subframes, significance information may be defined with finer precision. Another example is a configuration where predetermined numbers (predetermined sample counts) are set at sparse processing section 303 based on the above-mentioned significance information (e.g., (12, 8, 8, 6)). By thus having sparse processing section 303 determine predetermined sample counts using more flexible weights (significances) in accordance with a distribution of subframe energies with respect to a plurality of subframes, it is possible to reduce computation amounts even more efficiently than in the above-mentioned embodiment. The determining of the predetermined sample counts is made possible by preparing in advance a plurality of sets of patterns of predetermined sample counts. In addition, a configuration where the predetermined sample counts are determined dynamically based on significance information is also a possibility. However, whichever the configuration may be, the premise is that patterns of the predetermined sample counts are determined, or that the predetermined sample counts are dynamically determined, so that the computation amount may be reduced by a predetermined amount or more with respect to one frame as a whole.

In addition, for the present embodiment, cases have been described where sparse processing is performed on an input signal (in the cases above, sparsified perceptually weighted input signal $SWX_n$). However, with the present invention, similar effects as those of the above-mentioned embodiment can be obtained even when sparse processing is performed on a synthesized signal (in the cases above, synthesized signal $HP_n$) for which a correlation calculations is to be carried out with respect to the input signal, and sparse processing is by no means limited to being performed on the input signal. Specifically, at a coding apparatus, in accordance with the significance set for each subframe, the amplitude values of a predetermined number of samples taken from a plurality of samples forming at least one of the input signal and the synthesized signal of each subframe may be set to zero, and the correlation between the input signal and the synthesized signal may be computed. In addition, the present invention is equally applicable to a configuration where, with respect to both the input signal and the synthesized signal of each subframe, the amplitude values of a predetermined number of samples taken from a plurality of samples forming the signals are set to zero, and where the correlation between the input signal and the synthesized signal is computed.

In addition, for the present embodiment, cases have been described where sparse processing is performed on sparsified perceptually weighted input signal $SWX_n$. However, the present invention is equally applicable to cases where the input signal is neither preprocessed at preprocessing section 301, nor perceptually weighted at perceptual weighting section 302. In this case, it is assumed that sparse processing section 303 performs sparse processing on input signal $X_n$.

In addition, although the present embodiment has been described taking as an example a configuration where CELP coding section 203 employs a CELP-type coding scheme. However, the present invention is by no means limited thereto, and is equally applicable to coding schemes other than CELP-type coding schemes. One such example is a configuration where the present invention is applied to signal correlation computation between frames in computing coding parameters for the current frame without performing LPC analysis and using a signal coded in a previous frame.

In addition, coding apparatuses and coding methods according to the present invention are by no means limited to the embodiments above, and may be implemented with various modifications.

In addition, although the decoding apparatus in the embodiment above performs processing using coded information transmitted from the coding apparatus in the embodiment above, this is by no means limiting. So long as the coded information includes the requisite parameters and data, it need not necessarily be coded information from the coding apparatus in the embodiment above, as processing would still be possible.

In addition, the present invention is applicable to cases where operations are performed by having a signal processing program recorded on and written to a machine-readable recording medium (e.g., memory, disk, tape, CD, DVD, etc.), in which case similar effects to those of the present embodiment may be achieved.

The embodiments above have been described taking as examples cases where the present invention is configured with hardware. However, the present invention may also be realized through software in cooperation with hardware.

The functional blocks used in the descriptions for the embodiments above are typically realized as LSIs, which are integrated circuits. These may be individual chips, or some or all of them may be integrated into a single chip. Although the term LSI is used above, depending on the level of integration, they may also be referred to as IC, system LSI, super LSI, or ultra LSI.

The method of circuit integration is by no means limited to LSI, and may instead be realized through dedicated circuits or general-purpose processors. Field programmable gate arrays (FPGAs), which are programmable after LSI fabrication, or reconfigurable processors, whose connections and settings of circuit cells inside the LSI are reconfigurable, may also be used.

Furthermore, should there arise a technique for circuit integration that replaces LSI due to advancements in semiconductor technology or through other derivative techniques, such a technique may naturally be employed to integrate functional blocks. Applications of biotechnology, and/or the like, are conceivable possibilities.

The disclosure of the specification, drawings, and abstract included in Japanese Patent Application No. 2010-235279, filed on Oct. 20, 2010, is incorporated herein by reference in its entirety.

INDUSTRIAL APPLICABILITY

The present invention is able to efficiently reduce computation amounts in performing correlation calculations with respect to an input signal, and may be applied to packet communications systems, mobile communications systems, and/or the like, for example.

| Reference Signs List | |
|---|---|
| 101 | Coding apparatus |
| 102 | Transmission channel |
| 103 | Decoding apparatus |
| 201 | Subframe energy computation section |
| 202 | Significance assessment section |
| 203 | CELP coding section |
| 301 | Preprocessing section |
| 302 | Perceptual weighting section |
| 303 | Sparse processing section |
| 304 | LPC analysis section |
| 305 | LPC quantization section |
| 306, 403 | Adaptive excitation codebook |
| 307, 404 | Quantization gain generation section |
| 308, 405 | Fixed excitation codebook |
| 309, 310, 406, 407 | Multiplier section |
| 311, 313, 408 | Adder section |
| 312 | Perceptual weighting synthesis filter |
| 314 | Parameter determination section |
| 315 | Multiplexing section |
| 401 | Demultiplexing section |
| 402 | LPC decoding section |
| 409 | Synthesis filter |
| 410 | Post-processing section |

The invention claimed is:

1. A coding apparatus that codes an input signal to generate coded information, the coding apparatus comprising:
a first signal generation section that generates a first signal using the input signal;
a second signal generation section that generates a second signal through a predetermined method;
a setting section that sets a significance for each of a plurality of processing units obtained by dividing a frame of the input signal; and
a correlation computation section that sets, in accordance with the significance set for each of the processing units, amplitude values of a predetermined number of samples to zero, the predetermined number of samples being taken from a plurality of samples forming at least one of the first signal and the second signal of each processing unit, and that computes a correlation between the one signal, for which the amplitude values of the predetermined number of samples have been set to zero, and the other signal.

2. The coding apparatus according to claim 1, wherein the correlation computation section reduces the number of samples whose amplitude values are to be set to zero in accordance with how high the significance of the processing unit is.

3. The coding apparatus according to claim 1, wherein the setting section sets the significance based on an energy of each processing unit.

4. The coding apparatus according to claim 3, wherein the setting section sets the significance to a higher value in accordance with how high the energy of the processing unit is.

5. The coding apparatus according to claim 1, wherein the correlation computation section sets to zero the amplitude values of the predetermined number of samples with lesser amplitude values among the plurality of samples of each of the processing units.

6. The coding apparatus according to claim 1, wherein the correlation computation section computes the correlation as of a pitch period search.

7. The coding apparatus according to claim 1, wherein the setting section sets the significances in such a manner that there is always a difference between the significances of the processing units within the frame.

8. A communications terminal apparatus comprising the coding apparatus according to claim 1.

9. A base station apparatus comprising the coding apparatus according to claim 1.

10. A coding method of coding an input signal to generate coded information, the coding method comprising:
a first signal generation step of generating a first signal using the input signal;
a second signal generation step of generating a second signal through a predetermined method;
a setting step of setting a significance for each of a plurality of processing units obtained by dividing a frame of the input signal; and
a correlation computation step of setting, in accordance with the significance set for each of the processing units, amplitude values of a predetermined number of samples to zero, the predetermined number of samples being taken from a plurality of samples forming at least one of the first signal and the second signal of each processing unit, and of computing a correlation between the one signal, for which the amplitude values of the predetermined number of samples have been set to zero, and the other signal.

* * * * *